(12) United States Patent
Kim et al.

(10) Patent No.: US 9,436,048 B2
(45) Date of Patent: Sep. 6, 2016

(54) DISPLAY DEVICE AND METHOD OF MANUFACTURING THE SAME

(71) Applicant: Samsung Display Co., Ltd., Yongin, Gyeonggi-Do (KR)

(72) Inventors: Joon Sam Kim, Hwaseong-si (KR); Jong Hwan Kim, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 184 days.

(21) Appl. No.: 14/189,882

(22) Filed: Feb. 25, 2014

(65) Prior Publication Data

US 2015/0156867 A1 Jun. 4, 2015

(30) Foreign Application Priority Data

Nov. 29, 2013 (KR) .................. 10-2013-0147563

(51) Int. Cl.
  *H05K 7/10* (2006.01)
  *G02F 1/1345* (2006.01)
  *H05K 1/14* (2006.01)

(52) U.S. Cl.
  CPC ....... *G02F 1/13452* (2013.01); *G02F 2201/56* (2013.01); *H05K 1/147* (2013.01); *H05K 2201/09027* (2013.01); *H05K 2201/10128* (2013.01)

(58) Field of Classification Search
  CPC ............... H05K 1/0284; H05K 1/111; H05K 2201/09027; H05K 5/0017
  USPC .................. 361/767, 764, 774; 174/260, 261
  See application file for complete search history.

(56) References Cited

U.S. PATENT DOCUMENTS

| 5,319,185 A | * | 6/1994 | Obata ................ G06K 7/10891 235/455 |
| 2009/0325663 A1 | * | 12/2009 | Kelly .................. G07F 17/3267 463/16 |
| 2010/0078230 A1 | * | 4/2010 | Rosenblatt .............. G06F 3/041 178/18.01 |
| 2010/0302023 A1 | * | 12/2010 | Michaelis .............. B60K 37/02 340/461 |

FOREIGN PATENT DOCUMENTS

| KR | 10-2009-0059661 A | 6/2009 |
| KR | 10-2012-0042437 A | 5/2012 |
| KR | 10-2013-0004012 A | 1/2013 |
| KR | 10-2013-0024097 A | 3/2013 |

* cited by examiner

*Primary Examiner* — Yuriy Semenenko
(74) *Attorney, Agent, or Firm* — Knobbe Martens Olson & Bear LLP

(57) ABSTRACT

In an aspect, a display device comprising a panel having a circular surface and a pad unit which is disposed adjacent to an outer circumference of the panel and receives an external signal, wherein the pad unit is divided into a plurality of sub-pads, and the sub-pads are separated from each other is provided.

17 Claims, 18 Drawing Sheets

DISPLAY DEVICE AND METHOD OF MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. For example, this application claims priority from Korean Patent Application No. 10-2013-0147563 filed on Nov. 29, 2013 in the Korean Intellectual Property Office, the disclosure of which is incorporated herein by reference in its entirety.

BACKGROUND

1. Field

This disclosure relates to a display device and a method of manufacturing the same, and more particularly, to a circular display device and a method of manufacturing the same.

2. Description of the Related Technology

Display devices are devices that visually display data. Examples of the display devices include liquid crystal displays (LCDs), electrophoretic displays, organic light-emitting displays, inorganic electroluminescent (EL) displays, field emission displays, surface-conduction electron-emitter displays, plasma displays, and cathode ray displays.

A display device includes a pad unit for receiving driving signals from an external source at the edge of a surface of a display panel. The surface of the display panel is generally quadrangular, and the pad unit is arranged in a straight line along a side of the surface of the display panel.

Even in a circular display device including a display panel having a circular surface, not a quadrangular surface, the pad unit may be arranged in a straight line at the edge of a surface of the display panel. However, the circular display panel requires a larger non-display area for the pad unit than a conventional quadrangular display panel. This directly leads to an increase in the thickness of a bezel. Accordingly, a display area is reduced, thereby reducing the overall aperture ratio of the display device.

SUMMARY

Some embodiments provide a display device including a pad unit that can reduce the size of a non-display area and thus having an improved aperture ratio.

However, aspects of the disclosure may be embodied in various different forms, and should not be construed as being limited only to the illustrated embodiments. The above and other aspects of the present disclosure will become more apparent to one of ordinary skill in the art to which this technology pertains by referencing the detailed description of the present embodiments given below.

According to an aspect of the present disclosure, there is provided a display device comprising a panel having a circular surface and a pad unit which is disposed adjacent to an outer circumference of the panel and receives an external signal, wherein the pad unit is divided into a plurality of sub-pads, and the sub-pads are separated from each other.

In some embodiments, the display device further comprising a base film on which a semiconductor chip for transmitting the external signal to the pad unit is mounted, wherein the base film comprises a plurality of separate sub-films, and each of the sub-films comprises bumps connected to one of the sub-pads.

In some embodiments, the bumps are formed to correspond to each of the sub-pads.

In some embodiments, the sub-pads are separated by substantially equal distances.

In some embodiments, the sub-pads are symmetrical with respect to a virtual line that connects a central point on the surface of the panel and a point on a side of the panel.

In some embodiments, the sub-pads extend in a direction and have equal lengths.

In some embodiments, the panel comprises a display area in which display elements are located and a non-display area which surrounds the display area, wherein the pad unit is formed in the non-display area.

According to another aspect of the present disclosure, there is provided a display device comprising a panel having a circular surface and a pad unit which is disposed adjacent to an outer circumference of the panel and receives an external signal, wherein the pad unit is divided into a plurality of sub-pads, and the sub-pads are arranged along a side of the panel to be separated from each other.

In some embodiments, each of the sub-pads comprise a plurality of unit sub-pads, wherein each of the unit sub-pads forms a step difference with an adjacent unit sub-pad.

In some embodiments, the sub-pads are symmetrical with respect to a virtual line that connects a central point on the surface of the panel and a point on the side of the panel.

In some embodiments, the display device further comprising a base film on which a semiconductor chip for transmitting the external signal to the pad unit is mounted, wherein the base film comprises a plurality of separate sub-films, and each of the sub-films comprises bumps connected to one of the sub-pads.

In some embodiments, the bumps are formed to correspond to each of the sub-pads.

In some embodiments, each of the sub-films has a side rounded to correspond to the side of the panel.

In some embodiments, the panel comprises a display area in which display elements are located and a non-display area which surrounds the display area, wherein the pad unit is formed in the non-display area According to another aspect of the present disclosure, there is provided a display device comprising a panel having a circular surface and a pad unit which is disposed adjacent to an outer circumference of the panel and receives an external signal, wherein the pad unit is divided into a plurality of sub-pads which are arranged along a side of the panel, wherein the sub-pads are separated from each other, and the sub-pads and the side of the panel are separated by equal distances.

In some embodiments, each of the sub-pads comprise a plurality of unit sub-pads, wherein each of the unit sub-pads is placed toward a central point on the surface of the panel.

In some embodiments, the display device further comprising a film on which a semiconductor chip for transmitting the external signal to the pad unit is mounted, wherein the film comprises a plurality of separate sub-films, and each of the sub-films comprises bumps connected to one of the sub-pads.

In some embodiments, the bumps are formed to correspond to each of the sub-pads.

In some embodiments, each of the sub-films has a side rounded to correspond to the side of the panel.

In some embodiments, the panel comprises a display area in which display elements are located and a non-display area which surrounds the display area, wherein the pad unit is formed in the non-display area.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
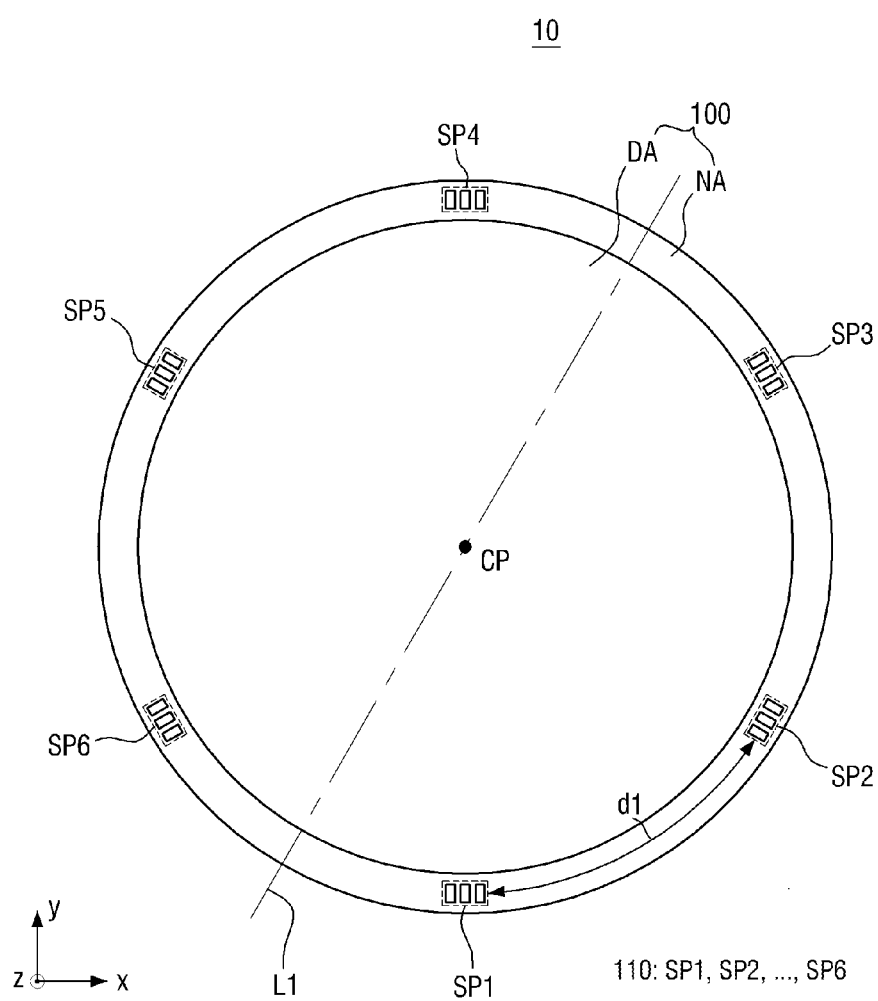
FIG. 1 is a plan view of a panel of a display device according to an embodiment of the present disclosure.

Advantages and features of the present disclosure and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the embodiments to those skilled in the art, and the present invention will only be defined by the appended claims. Thus, in some embodiments, well-known structures and devices are not shown in order not to obscure the description of the embodiments with unnecessary detail. Like numbers refer to like elements throughout. In the drawings, the thickness of layers and regions are exaggerated for clarity.

It will be understood that when an element or layer is referred to as being "on," "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Hereinafter, embodiments of the present disclosure will be described with reference to the attached drawings.

Figure 2:
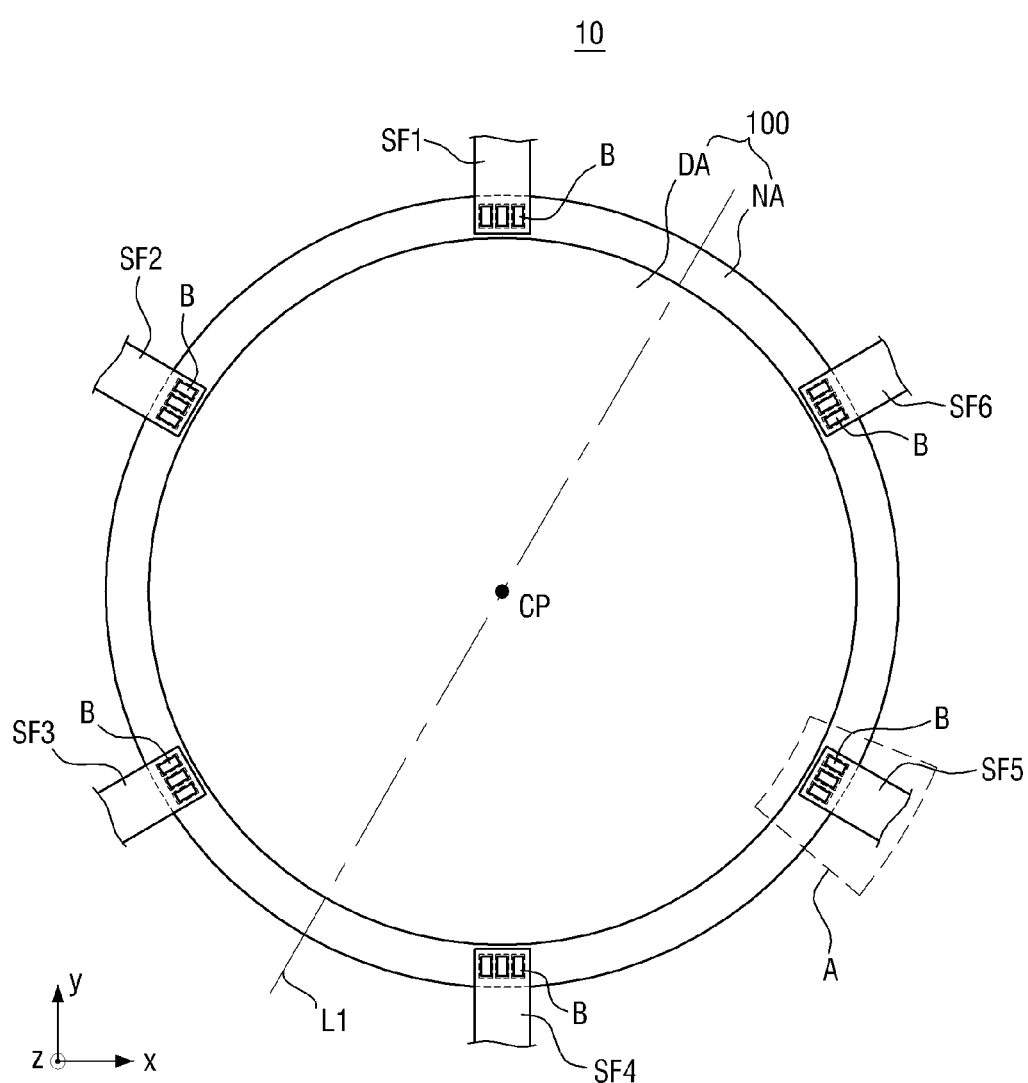
FIG. 2 is a plan view of the display device according to an embodiment of the present disclosure.
Figure 3:
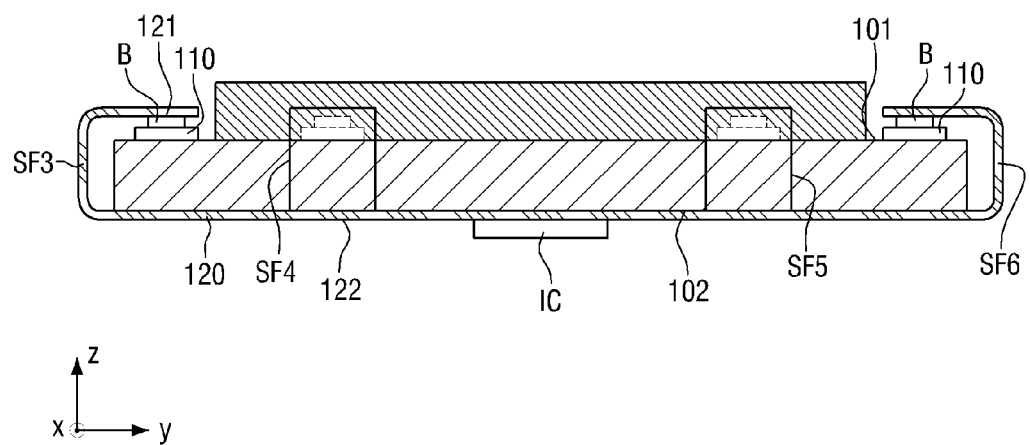
FIG. 3 is a side view of the display device according to an embodiment of the present disclosure.
Figure 4:
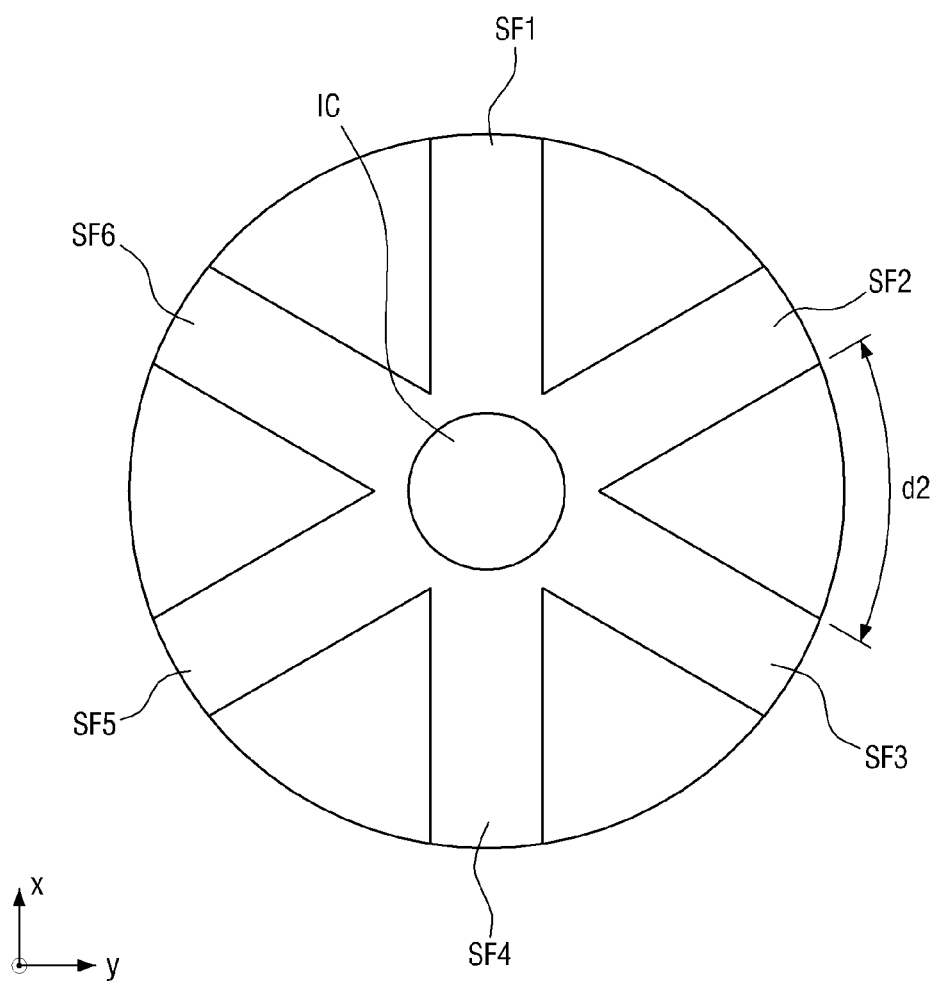
FIG. 4 is a bottom view of the display device according to an embodiment of the present disclosure.
Figure 5:
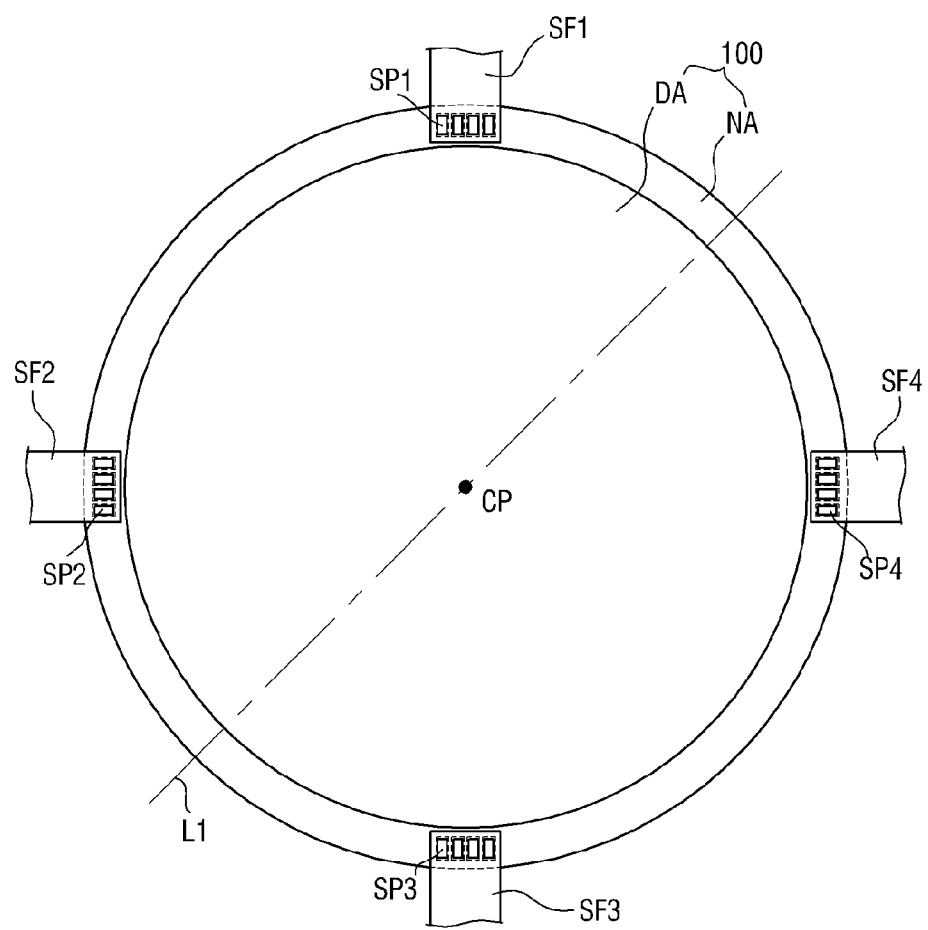
FIGS. 5 and 6 are plan views of display devices according to other embodiments of the present disclosure.
Figure 6:
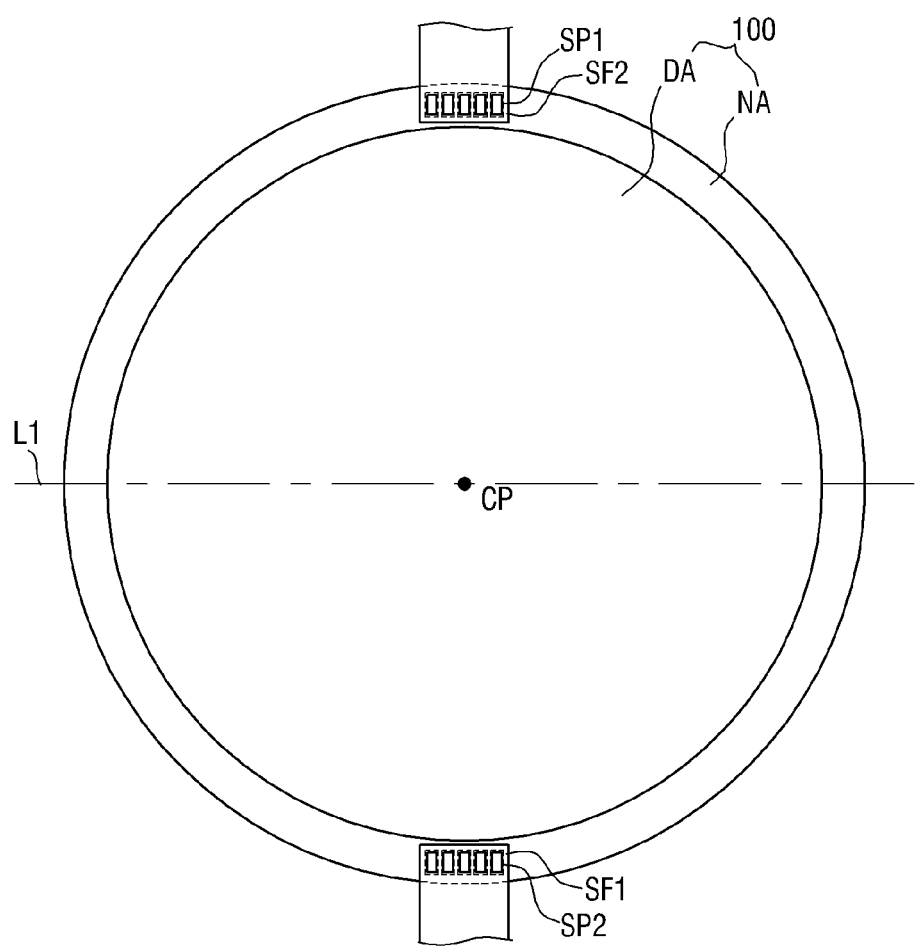

FIG. 1 is a plan view of a panel 100 of a display device 10 according to an embodiment of the present disclosure. FIG. 2 is a plan view of the display device according to an embodiment of the present disclosure. FIG. 3 is a side view of the display device according to an embodiment of the present disclosure. FIG. 4 is a bottom view of the display device according to an embodiment of the present disclosure. FIGS. 5 and 6 are plan views of display devices 11 and 12 according to other embodiments of the present disclosure.

Referring to FIGS. 1 through 4, the display device 10 according an embodiment may include the panel 100 and a pad unit 110 (as shown if FIG. 3).

In some embodiments, the panel 100 may be a display panel that displays images. In some embodiments, a surface of the panel 100 may be circular. In some embodiments, the panel 100 may also have a shape including an at least partially rounded side. In an exemplary embodiment, the panel 100 may also be elliptical. In some embodiments, the panel 100 may include the pad unit 110 which is disposed adjacent to an outer circumference of the panel 100 and receives external signals. In some embodiments, the panel 100 may include a display area DA and a non-display area NA which surrounds the display area DA. In some embodiments, the non-display area NA may be shaped like, but not limited to, a donut that surrounds the circular display area DA as illustrated in FIG. 1. Display elements may be formed in the display area DA, and the pad unit 110 may be formed in the non-display area NA. Aspects of the embodiments including specific configurations of the panel 100 will be described later.

In some embodiments, the pad unit 110 may receive driving signals for driving the panel 100 from an external source. In some embodiments, the driving signals may include gate signals, data signals, etc. In some embodiments, the pad unit 110 may be divided into a plurality of sub-pads SP. In some embodiments, each of the sub-pads SP may receive one or more gate signals or one or more data signals needed to drive the panel 100 and transmit the received signal or signals to the panel 100. For example, first through third sub-pads SP1 through SP3 may receive gate signals, and fourth through sixth sub-pads SP4 through SP6 may receive data signals. However, the present embodiments are not limited thereto. In some embodiments, each of the sub-pads SP may transmit one or more received signals to the display area DA of the panel 100. In some embodiments, the sub-pads SP may be separated from each other. In some embodiments, the sub-pads SP may be separated by substantially equal distances d1. In addition, the sub-pads SP may be symmetrical with respect to a virtual line that connects a central point CP on the surface of the panel 100 and a point on a side of the panel 100. That is, the first, second and third sub-pads SP1, SP2 and SP3 may respectively be symmetrical to the sixth, fifth and fourth sub-pads SP6, SP5 and SP4 with respect to a virtual line L1.

Referring to FIG. 2, the display device 10 according to an embodiment may further include a base film 120 (as shown if FIG. 3) on which a semiconductor chip IC (as shown if FIG. 3) for transmitting the external signals is mounted. In some embodiments, the base film 120 may be formed of a material having insulating properties and flexibility. Referring to FIG. 2, the base film 120 may include six sub-films SF (SF1 through SF6). In an exemplary embodiment, the base film 120 may include any one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and various combinations thereof. In some embodiments, the semiconductor chip IC may be mounted on the base film 120, and bumps B may be formed on the upper surface of the base film 120. Referring to FIG. 3, the base film 120 may be formed on a lower surface 102 of the panel 100, and ends of the base film 120 may be bent to cover ends of an upper surface 101 of a substrate. Here, a surface of the panel 100 which contacts the base film 120 is defined as the lower surface 102, and an opposite surface is defined as the upper surface 101. In some embodiments, the base film 120 may include an upper surface 121 and a lower surface 122. Here, a surface of the base film 120 which contacts the panel 100 is defined as the upper surface 121, and an opposite surface is defined as the lower surface 122. In some embodiments, the semiconductor chip IC may be mounted on the lower surface 122 of the base film 120, and bumps B may be formed on the upper surface 121 of the base film 120. However, the present embodiments are not limited thereto. In some embodiments, the semiconductor chip IC and the bumps B may be formed on the same surface. In some embodiments, the semiconductor chip IC and the bumps B may be connected by wiring (not illustrated) formed inside the base film 120. In some embodiments, the bumps B may be electrically connected to the pad unit 110 formed on the ends of the upper surface 101 of the substrate. That is, the semiconductor chip IC may transmit gate signals and data signals to the pad unit 110 of the display device 10 via the wiring of the base film 120.

In some embodiments, the base film 120 may include a plurality of separate sub-films SF. In some embodiments, the sub-films SF may be connected to the sub-pads SP, respectively. That is, the number of the sub-films SF may be equal to the number of sub-pads SP, and the sub-films SF may be separated by substantially equal distances d2 (as shown if FIG. 4). Referring to FIG. 4, the base film 120 may include six sub-films SF (SF1 through SF6). In some embodiments, each of the sub-films SF may extend from the semiconductor IC formed at a center of the base film 120 toward a corresponding sub-pad SP. In some embodiments, each of the sub-films SF may transmit a signal of the semiconductor chip IC to a corresponding sub-pad SP. The shape or number of the semiconductor chips IC is not limited to the example illustrated in FIG. 4. In some embodiments, the semiconductor chip IC may be formed in a plurality, and the semiconductor chips IC may provide individual signals to the sub-films SF, respectively.

In some embodiments, each of the sub-films SF may include bumps B connected to a corresponding sub-pad SP. In some embodiments, the bumps B may be formed on the upper surface 121 of each of the sub-films SF. In some embodiments, the bumps B may include a conductive material and may respectively be electrically connected to the sub-pads SP so as to transmit signals of the semiconductor IC to the sub-pads SP. Aspects of the embodiments including shapes and structures of the bumps B and the sub-pads SP will be described later.

As described above, the display device 10 according to some embodiments may include a plurality of sub-pads SP which are disposed in the non-display area NA of the panel 100 to be separated from each other. Accordingly, the area of the non-display area NA can be minimized compared with a conventional circular display device in which pad units are arranged in a straight line. Consequently, this can increase the area of the display area DA. That is, the display device 10 according to some embodiments can provide an improved aperture ratio. In some embodiments, the number of the sub-pads SP may be six as illustrated in FIG. 2. However, the present embodiments are not limited thereto. In some embodiments, display device 11 may include a pad unit 110 divided into four sub-pads SP as illustrated in FIG. 5. In this case, the number of unit sub-pads VP included in each of the sub-pads SP may be, but is not limited to, four. A display device 12 according to another embodiment of the present invention may include a pad unit 110 divided into two sub-pads SP as illustrated in FIG. 6. In this case, the number of unit sub-pads VP included in each of the sub-pads SP may be, but is not limited to, five.

Embodiments showing configurations of the panel 100 and shapes and structures of bumps B and sub-pads SP will now be described in greater detail with reference to FIGS. 7 and 8.

Figure 7:
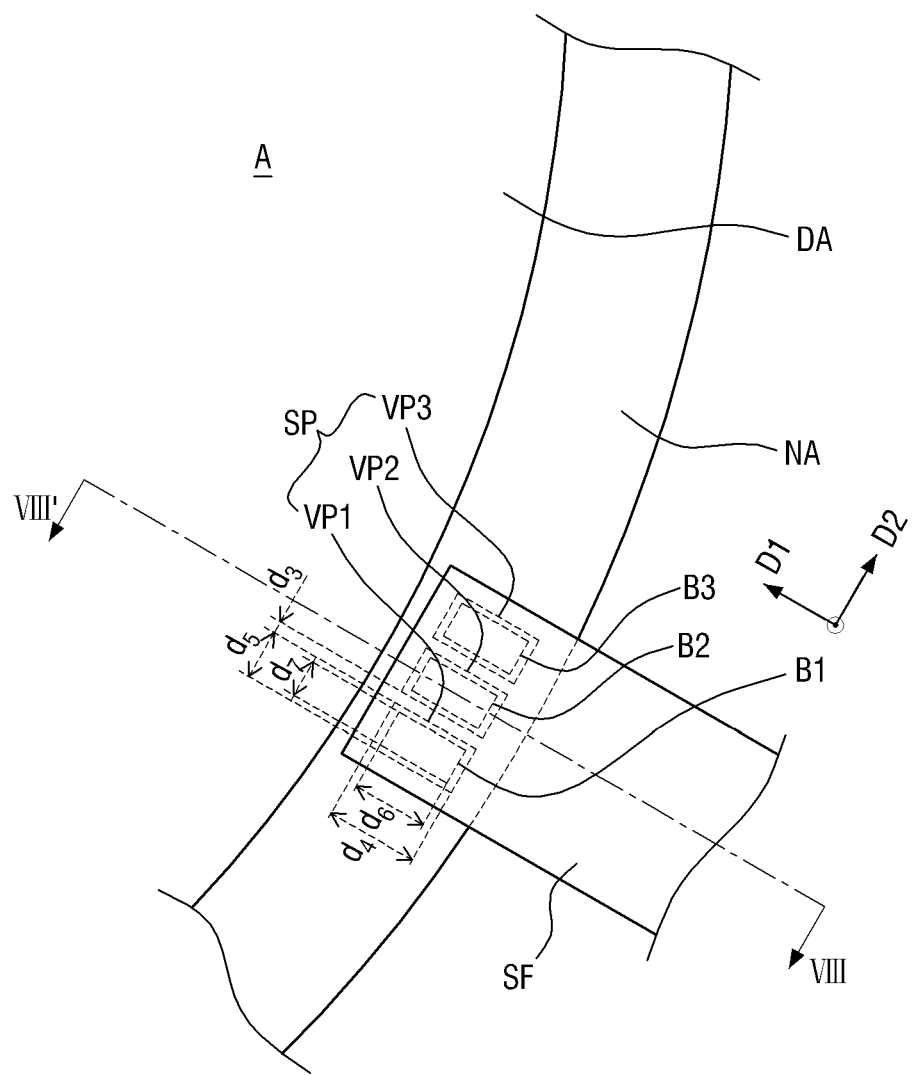
FIG. 7 is an enlarged view of a region A of FIG. 2.
Figure 8:
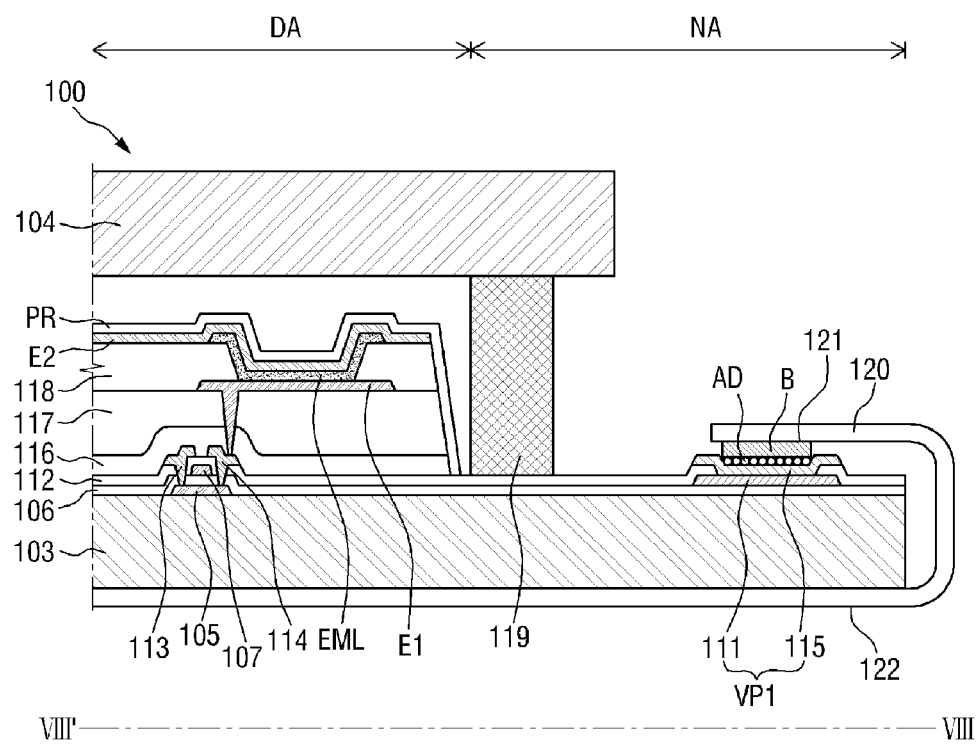
FIG. 8 is a cross-sectional view taken along the line VIII-VIII' of FIG. 7.

FIG. 7 is an enlarged view of a region A of FIG. 2, and FIG. 8 is a cross-sectional view taken along the line VIII-VIII' of FIG. 7.

Referring to FIG. 7, a sub-pad SP may include one or more unit sub-pads VP (VP1 through VP3), and a sub-film SF overlapping the sub-pad SP may include one or more sub-bumps B1 through B3 connected to the unit sub-pads VP, respectively. In some embodiments, the unit sub-pads VP may be arranged along a straight line in the non-display area NA. In an exemplary embodiment, the unit sub-pads VP may be arranged in a straight line in a second direction D2 and may extend in a first direction D1 perpendicular to the second direction D2. In some embodiments, the unit sub-pads VP may be separated by equal distances d3. In addition, lengths d4 and d5 of long sides and short sides of each of the unit sub-pads VP may be equal to those of long sides and short sides of another unit sub-pad VP. In addition, lengths d6 and d7 of long sides and short sides of each of the sub-bumps B1 through B3 and lengths d6 and d7 may be smaller than lengths d4 and d5. In FIG. 7, sides of each of the unit sub-pads VP which are parallel to the first direction D1 are long sides. However, the present embodiments are not limited thereto. In some embodiments, sides of each of the unit sub-pads VP which are parallel to the second direction D2 may be long sides. The non-display area NA according to some embodiments only provides a space for mounting the sub-pads SP. Therefore, the creation of an unnecessary area can be prevented, and the size of the non-display area NA can be reduced. As a result, a display device having a narrow bezel can be provided.

In some embodiments, the sub-bumps B1 through B3 may also be arranged at regular intervals. The sub-bumps B1 through B3 may correspond to the unit sub-pads VP, respectively. In some embodiments, each side of each of the sub-bumps B1 through B3 may be shorter than each side of each of the unit sub-pads VP. That is, each of the sub-bumps B1 through B3 may be disposed on a corresponding unit sub-pad VP having a larger area than the sub-bump and may be electrically connected to the unit sub-pad VP.

Referring to FIG. 8, the panel 100 may include a first substrate 103, a semiconductor pattern 105, a gate insulating layer 106, a gate electrode 107, a pad terminal 111, an interlayer insulating film 112, a source electrode 113, a drain electrode 114, an auxiliary terminal 115, an intermediate layer 116, a planarization layer 117, a pixel defining layer 118, a first electrode E1, an organic light-emitting layer EML, a second electrode E2, a passivation layer PR, a second substrate 104, and a sealant 119. In some embodiments, the pad terminal 111 and the auxiliary terminal 115 may form one unit sub-pad VP.

In some embodiments, the first substrate 103 may include an at least partially rounded side. In an exemplary embodiment, a surface of the first substrate 103 may be circular. However, the present embodiments are not limited thereto, and the surface of the first substrate 103 may also be, e.g., elliptical.

In some embodiments, the first substrate 103 may include a transparent insulating substrate. For example, the first substrate 103 may be a glass substrate, a quartz substrate, a transparent resin substrate, etc. In addition, the first substrate 103 may include a polymer with high thermal resistance. In an example, the first substrate 103 may include any one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and various combinations thereof.

In some embodiments, the first substrate 103 may have flexibility. That is, the first substrate 103 may be a deformable substrate that can be rolled, folded, bent, etc.

In some embodiments, the first substrate 103 may include a display area DA and a non-display area NA.

In some embodiments, the display area DA may be an area where images are displayed. In addition, the display area DA may be an area where display elements for actually displaying an image and thin-film transistors (TFTs) electrically connected to the display elements are located. The display elements may be, but are not limited to, organic light-emitting elements. In addition, the display area DA may be located in the middle of the first substrate 103. The display area DA may be circular. However, the present invention is not limited thereto, and the display area DA may also be elliptical.

In some embodiments, the non-display area NA may be an area where no images are displayed. In addition, the non-display area NA may be an area where the sealant 119 and the unit sub-pads VP are located. The non-display area NA may be adjacent to the edge of the first substrate 103. That is, the non-display area NA may be located in an edge portion of the first substrate 103.

In some embodiments, the non-display area NA may surround the display region DA. In an exemplary embodiment, the non-display area NA may be shaped like a circular donut that surrounds all around the display area DA.

Although not illustrated in the drawing, a buffer layer may be disposed on the first substrate 103. In some embodiments, the buffer layer may prevent the diffusion of metallic atoms, impurities, etc. from the first substrate 103. If the surface of the first substrate 103 is not even, the buffer layer may improve the flatness of the surface of the first substrate 103.

In some embodiments, the buffer layer may be formed of a silicon compound such as silicon oxide, silicon nitride, silicon oxynitride, silicon oxycarbide, silicon carbonitride, etc. These materials may be used alone or in combination. In other exemplary embodiments, the buffer layer may have a single layer structure or a multilayer structure including a silicon compound. For example, the buffer layer may include a silicon oxide layer, a silicon nitride layer, a silicon oxynitride layer, a silicon oxycarbide layer, and/or a silicon carbonitride layer. In some embodiments, the buffer layer can be omitted, depending on the surface flatness, material, etc. of the first substrate 103.

In some embodiments, the semiconductor pattern 105 may be formed on the first substrate 103. Specifically, the semiconductor pattern 105 may be located on the display area DA of the first substrate 103. If the buffer layer is formed on the first substrate 103, the semiconductor pattern 105 may be formed on the buffer layer. In some embodiments, the semiconductor pattern 105 may be formed of amorphous semiconductor, microcrystalline semiconductor, or polycrystalline semiconductor. Preferably, the semiconductor pattern 105 may be formed of polycrystalline semiconductor.

In some embodiments, the gate insulating layer 106 may be formed on the buffer layer to cover the semiconductor pattern 105. In some embodiments, the gate insulating layer 106 may be located on the display area DA and the non-display area NA of the first substrate 103. In some embodiments, the gate insulating layer 106 may be formed of silicon oxide, silicon nitride, or metal oxide. Examples of the metal oxide that can be used in the gate insulating layer 106 may include hafnium oxide, aluminum oxide, zirconium oxide, titanium oxide, and tantalum oxide. These materials may be used alone or in combination. In some embodiments, the gate insulating layer 106 may be formed on the buffer layer to a substantially uniform thickness along the profile of the semiconductor pattern 105. In some embodiments, the gate insulating layer 106 may be relatively thin and may have steps formed adjacent to the semiconductor pattern 105. In other exemplary embodiments, the gate insulating layer 106 may have a substantially flat top surface while fully covering the semiconductor pattern 105. In this case, the gate insulating layer 106 may be relatively thick.

In some embodiments, the gate electrode 107 may be formed on the gate insulating layer 106. In some embodiments, the gate electrode 107 may be located on the display area DA of the first substrate 103. In some embodiments, the gate electrode 107 may be formed on a portion of the gate insulating layer 106 under which the semiconductor pattern 105 is located. In some embodiments, the gate electrode 107 may include a metal, an alloy, metal nitride, conductive metal oxide, a transparent conductive material, etc. In an example, the gate electrode 107 may include aluminum (Al), an aluminum-containing alloy, aluminum nitride, silver (Ag), a silver-containing alloy, tungsten (W), tungsten nitride, copper (Cu), a copper-containing alloy, nickel (Ni), chrome (Cr), chrome nitride, molybdenum (Mo), a molybdenum-containing alloy, titanium (Ti), titanium nitride, platinum (Pt), tantalum (Ta), tantalum nitride, neodymium (Nd), scandium (Sc), strontium ruthenium oxide, zinc oxide, indium tin oxide (ITO), tin oxide, indium oxide, gallium oxide, indium zinc oxide (IZO), etc. These materials may be used alone or in combination. According to exemplary embodiments, the gate electrode 107 may have a single layer structure composed of the metal, the alloy, the metal nitride, the conductive metal oxide, or the transparent conductive material described above. Otherwise, the gate electrode 107 may have a multilayer structure composed of the metal, the alloy, the metal nitride, the conductive metal oxide, and/or the transparent conductive material. In exemplary embodiments, the gate electrode 107 may be substantially narrower than the semiconductor pattern 105. For example, a width of the gate electrode 107 may be substantially equal or similar to that of the channel portion. In some embodiments, the gate electrode 107 and the channel portion may overlap each other. However, the dimensions of the gate electrode 107 and/or the dimensions of the channel portion may vary according to electrical characteristics required of a switching element including the gate electrode 107 and the channel portion.

In some embodiments, the pad terminal 111 may also be formed on the gate insulating layer 106. In some embodiments, the pad terminal 111 may be located on the non-display area NA of the first substrate 103. In some embodiments, the pad terminal 111 may include a metal, an alloy, metal nitride, conductive metal oxide, a transparent conductive material, etc. In an example, the pad terminal 111 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. According to exemplary embodiments, the pad terminal 111 may have a single layer structure composed of the metal, the alloy, the metal nitride, the conductive metal oxide, or the transparent conductive material described above. Otherwise, the pad terminal 111 may have a multilayer structure composed of the metal, the alloy, the metal nitride, the conductive metal oxide, and/or the transparent conductive material. In some embodiments, the pad terminal 111 may be formed of the same material as the gate electrode 107. In addition, the pad terminal 111 may be formed at the same time as the gate electrode 107.

In some embodiments, the interlayer insulating film 112 may be formed on the gate insulating layer 106 to cover the gate electrode 107 and the pad terminal 111. In some embodiments, the interlayer insulating film 112 may be formed on the display area DA and the non-display area NA of the first substrate 103. In some embodiments, the interlayer insulating film 112 may be formed on the gate insulating layer 106 to a substantially uniform thickness along the profile of the gate electrode 107 and the pad terminal 111. Therefore, the interlayer insulating film 112 may have steps formed adjacent to the gate electrode 107 and the pad terminal 111. In some embodiments, the interlayer insulating film 112 may be formed of a silicon compound such as silicon oxide, silicon nitride, silicon oxynitride, silicon carbonitride, silicon oxycarbide, etc. These materials may be used alone or in combination. In some embodiments, the interlayer insulating film 112 may have a single layer structure or a multilayer structure including silicon oxide, silicon nitride, silicon oxynitride, silicon carbonitride, silicon oxycarbide, etc. Further, the interlayer insulating film 112 may be formed of substantially the same material as the gate insulating layer 106. In some embodiments, the interlayer insulating film 112 may insulate the gate electrode 107 from the source electrode 113 and the drain electrode 114 which will be formed subsequently.

In some embodiments, the interlayer insulating film 112 may include first contact holes which partially expose the semiconductor pattern 105 and a second contact hole which partially exposes the pad terminal 111. In some embodiments, the first contact holes may be formed on the display area DA of the first substrate 103. In an exemplary embodiment, the first contact holes may expose a source portion and a drain portion of the semiconductor pattern 105. If the gate insulating layer 106 is disposed on the semiconductor pattern 105 as in the exemplary embodiment of FIG. 2, the first contact holes may be formed to penetrate through the gate insulating layer 106. In some embodiments, the first contact holes may extend in a direction perpendicular to the surface of the first substrate 103. In some embodiments, the second contact hole may be formed on the non-display area NA of the first substrate 103. In an exemplary embodiment, the second contact hole may expose a central portion of the pad terminal 111. In some embodiments, the second contact hole may extend in the direction perpendicular to the surface of the first substrate 103.

In some embodiments, the source electrode 113 and the drain electrode 114 may be formed on the interlayer insulating film 112. Specifically, the source electrode 113 and the drain electrode 114 may be inserted into the first contact holes, respectively. That is, the source electrode 113 and the drain electrode 114 may be formed on the display area DA of the first substrate 103. In some embodiments, the source electrode 113 and the drain electrode 114 may be separated by a predetermined distance with respect to the gate electrode 107 and may be disposed adjacent to the gate electrode 107. For example, the source electrode 113 and the drain electrode 114 may penetrate through the interlayer insulating film 112 and the gate insulating layer 106 to contact the source portion and the drain portion of the semiconductor pattern 105, respectively. In some embodiments, each of the source electrode 113 and the drain electrode 114 may include a metal, an alloy, metal nitride, conductive metal oxide, a transparent conductive material, etc. In an example, each of the source electrode 113 and the drain electrode 114 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. In some embodiments, each of the source electrode 113 and the drain electrode 114 may have a single layer structure or a multilayer structure composed of the metal, the alloy, the metal nitride, the conductive metal oxide, or the transparent conductive material described above.

In some embodiments, the formation of the source electrode 113 and the drain electrode 114 on the interlayer insulating film 112 may produce a TFT, which includes the semiconductor pattern 105, the gate insulating layer 106, the gate electrode 107, the source electrode 113 and the drain electrode 114, on the first substrate 103 as a switching element of an organic light-emitting display (OLED). Here, the TFT may be a top gate TFT.

In some embodiments, the auxiliary terminal 115 may also be formed on the interlayer insulating film 112. Specifically, the auxiliary terminal 115 may be inserted into the second contact hole. In some embodiments, the auxiliary terminal 115 may be formed on the non-display area NA of the first substrate 103. In some embodiments, the auxiliary terminal 115 may include a metal, an alloy, metal nitride, conductive metal oxide, a transparent conductive material, etc. In an example, the auxiliary terminal 115 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. In some embodiments, the auxiliary terminal 115 may have a single layer structure or a multilayer structure composed of the metal, the alloy, the metal nitride, the conductive metal oxide, or the transparent conductive material described above. In some embodiments, the auxiliary terminal 115 may be formed of the same material as the source electrode 113 and the drain electrode 114. In some embodiments, the auxiliary terminal 115 may be formed at the same time as the source electrode 113 and the drain electrode 114.

In some embodiments, one pad terminal 111 and one auxiliary terminal 115 may form one unit sub-pad VP. In some embodiments, the unit sub-pad VP may receive a signal that is transmitted from the base film 120 to a display element.

In some embodiments, the intermediate layer 116 may be formed on the source electrode 113 and the drain electrode 114. That is, the intermediate layer 116 may be formed on the interlayer insulating film 112 to cover the source electrode 113 and the drain electrode 114. In some embodiments, the intermediate layer 116 may be formed on the display area DA of the first substrate 103. In some embodiments, the intermediate layer 116 may be thick enough to completely cover the source electrode 113 and the drain electrode 114. In some embodiments, the intermediate layer 116 may be formed of an organic material or an inorganic material. For example, the intermediate layer 116 may include photoresist, acrylic-based polymer, polyimide-based polymer, polyamide-based polymer, siloxane-based polymer, polymer containing photosensitive acryl carboxyl, novolak resin, alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in combination. According to other exemplary embodiments, the intermediate layer 116 that covers the TFT may not be provided, depending on the material, dimensions, etc. of the planarization layer 117 which will be formed subsequently.

In some embodiments, the planarization layer 117 may be formed on the intermediate layer 116. In some embodiments, the planarization layer 117 may be formed on the display area DA of the first substrate 103. In some embodiments, a surface of the planarization layer 117 may be flat. That is, the planarization layer 117 may be formed thick enough to planarize its surface on which pixels are to be located. In some embodiments, the planarization layer 117 may be formed of an insulating material. In some embodiments, the planarization layer 117 may be formed of an organic material such as polyimide. Further, the planarization layer 117 may have a single layer structure or a multilayer structure including two or more insulating layers.

In some embodiments, the planarization layer 117 may include a via hole that partially exposes the drain electrode 114. In an exemplary embodiment, the via hole may expose a central portion of the drain electrode 114. The via hole may extend in the direction perpendicular to the surface of the first substrate 103.

In some embodiments, the first electrode E1 may be disposed on the planarization layer 117. In some embodiments, the first electrode E1 may be formed on the display area DA of the first substrate 103. In some embodiments, the first electrode E1 may be inserted into the via hole so as to be electrically connected to the drain electrode 114. In some embodiments, the first electrode E1 may be an anode or a cathode. If the first electrode E1 is an anode, the second electrode E2 may be a cathode. Embodiments of the present disclosure will be described below based on the assumption that E1 is an anode. However, the first electrode E1 may also be a cathode, and the second electrode E2 may also be an anode.

To be used as an anode, the first electrode E1 may be formed of a conductive material with a high work function. In the case of a bottom emission display device, the first electrode E1 may be formed of a material such as ITO, IZO, ZnO or $In_2O_3$ or may be formed of a stacked layer of these materials. In the case of a top emission display device, the first electrode E1 may further include a reflective layer formed of Ag, Mg, Al, Pt, Pd, Au, Ni, Nd, Ir, Cr, Li or Ca. In some embodiments, the first electrode E1 can be modified in various ways to have, for example, a structure composed of two or more layers formed using two or more different materials selected from the above materials.

In some embodiments, the pixel defining layer 118 may be formed on the first electrode E1. In some embodiments, the pixel defining layer 118 may be formed on the display area DA of the first substrate 103. In some embodiments, the pixel defining layer 118 may partially expose the first electrode E1. In some embodiments, the pixel defining layer 118 may be formed of at least one organic material selected from benzocyclobutene (BCB), polyimide (PI), polyamaide (PA), acrylic resin and phenolic resin or an inorganic material such as silicon nitride. In some embodiments, the pixel defining layer 118 may also be formed of a photosensitizer that contains a black pigment. In some embodiments, the pixel defining layer 118 may serve as a light-blocking member.

In some embodiments, the organic light-emitting layer EML may be formed on the first electrode E1. In some embodiments, the organic light-emitting layer EML may be formed on the display area DA of the first substrate 103. In response to an electric current supplied to the organic light-emitting layer EML, electrons and holes within the organic light-emitting layer EML may recombine to form excitons, and energy from the excitons may generate light of a certain wavelength.

In some embodiments, the organic light-emitting layer EML may be formed of a small molecular weight organic material or a polymer organic material. In some embodiments, the organic light-emitting layer EML may include a hole-injection layer (HIL), a hole-transporting layer (HTL), a hole-blocking layer (HBL), an emitting layer (EML), an electron-transporting layer (ETL), an electron-injection layer (EIL), and an electron-blocking layer (EBL).

In some embodiments, the second electrode E2 may be formed on the organic light-emitting layer EML. In some embodiments, the second electrode E2 may be formed on the display area DA of the first substrate 103. To be used as a cathode, the second electrode E2 may be formed of a conductive material with a low work function. In an exemplary embodiment, the second electrode E2 may be formed of Ag, Mg, Al, Pt, Pd, Au, Ni, Nd, Ir, Cr, Li or Ca.

In some embodiments, the formation of the second electrode E2 on the organic light-emitting layer EML may produce an organic light-emitting element, which includes the first electrode E1, the organic light-emitting layer EML and the second electrode E2, on the first substrate 100 as a display element of the display device.

In some embodiments, the passivation layer PR may be formed on the second electrode E2. In some embodiments, the passivation layer PR may be formed on the display area DA of the first substrate 103. In some embodiments, the passivation layer PR may protect the display elements from external moisture or oxygen, thereby preventing degradation of the display elements.

In some embodiments, the passivation layer PR may be an organic layer, an inorganic layer, or a multilayer composed of the organic layer and the inorganic layer. In some embodiments, the inorganic layer may be an insulating layer such as a silicon oxide ($SiO_2$) layer, a silicon nitride layer, or a silicon oxynitride layer. In some embodiments, the inorganic layer may be a LiF layer. In some embodiments, the organic layer may be a layer containing NPB (N,N'-Bis(naphthalen-1-yl)-N,N'-bis(phenyl)benzidine), TNATA, TCTA, TDAPB, TDATA, $Alq_3$, Balq or CBP. The passivation layer PR may be formed by evaporation, chemical vapor deposition (CVD), or sputtering.

In some embodiments, the second substrate 104 may be disposed on the passivation layer PR. In some embodiments, the second substrate 104 may be separated from the passivation layer PR by a predetermined distance. In some embodiments, a space between the second substrate 104 and the passivation layer PR may be filled with nitrogen, etc. In some embodiments, the second substrate 104 may face the first substrate 103. In some embodiments, the second substrate 104 may be substantially parallel to the first substrate 103. In some embodiments, the second substrate 104 may be positioned to cover the whole of the display area DA and part of the non-display area NA of the first substrate 103. In some embodiments, the second substrate 104 may encapsulate the display elements and the TFTs, together with the sealant 119.

In some embodiments, the second substrate 104 may be transparent insulating glass or plastic, but is not limited thereto, and may be formed of various materials that can block external substances. In an exemplary embodiment, the second substrate 104 may be formed of the same material as the first substrate 103.

In some embodiments, the sealant 119 may be located in the edge portion of each of the first substrate 103 and the second substrate 104. In an exemplary embodiment, the sealant 119 may be located on the non-display area NA of the first substrate 103. In some embodiments, the sealant 119 may contact the interlayer insulating film 112 disposed on the first substrate 103. However, the present embodiments are not limited thereto, and the sealant 119 may also contact the gate insulating layer 106 or the first substrate 103. In the exemplary embodiment of FIG. 2, the sealant 119 may encapsulate the display elements and the TFTs by contacting the interlayer insulating film 112 and the second substrate 104. In some embodiments, the base film 120 may be disposed on an end of the panel 100. In the exemplary embodiment of FIG. 1, one base film 120 is disposed under the panel 100. However, the present embodiments are not limited thereto, and two base films 120 may also be disposed on and under the panel 100, respectively. In some embodiments, the base film 120 may transmit various signals to the panel 100. In some embodiments, the base film 120 may be attached onto the panel 100 by an adhesive member AD.

Here, the adhesive member AD may include a plurality of conductive particles to electrically connect the panel 100 and the base film 120. That is, the base film 120 may be fixed to the panel 100 by the adhesive member AD and provide various signals to the panel 100 in a stable manner. In some embodiments, the base film 120 may be bent on an end and may include an upper surface 121 and a lower surface 122. In some embodiments, the bumps B may be formed on the upper surface 121 of the base film 120 that faces first substrate 103.

A display device according to another embodiment of the present disclosure will now be described.

Figure 9:
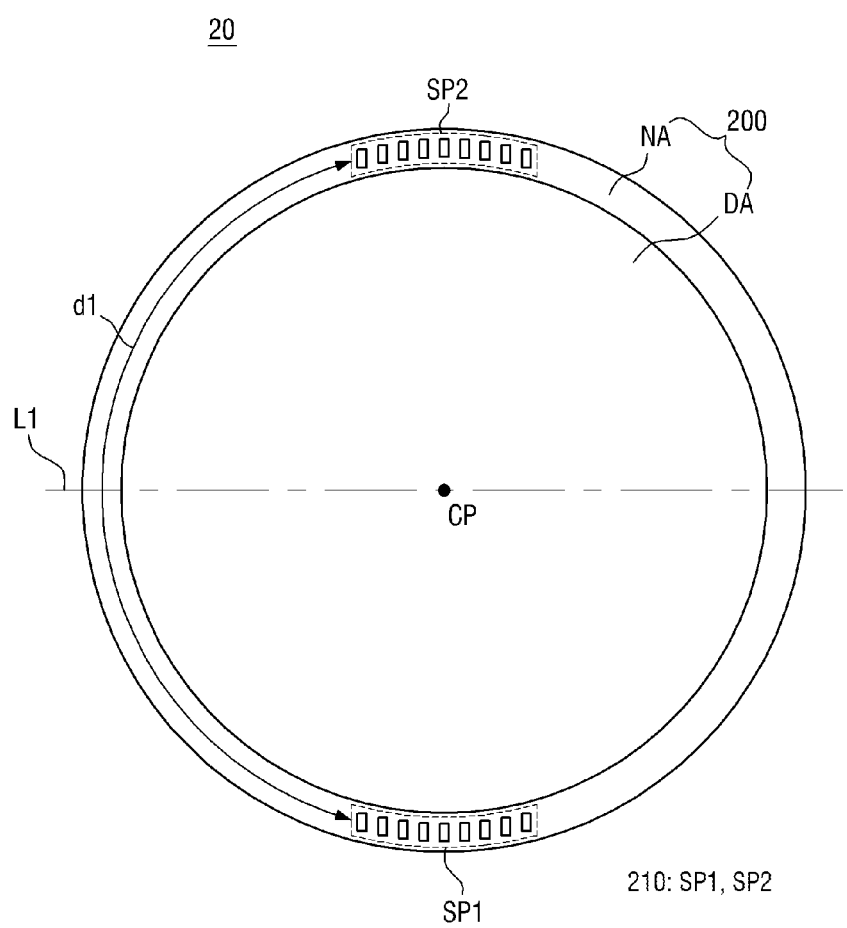
FIG. 9 is a front view of a panel of a display device according to another embodiment of the present disclosure.
Figure 10:
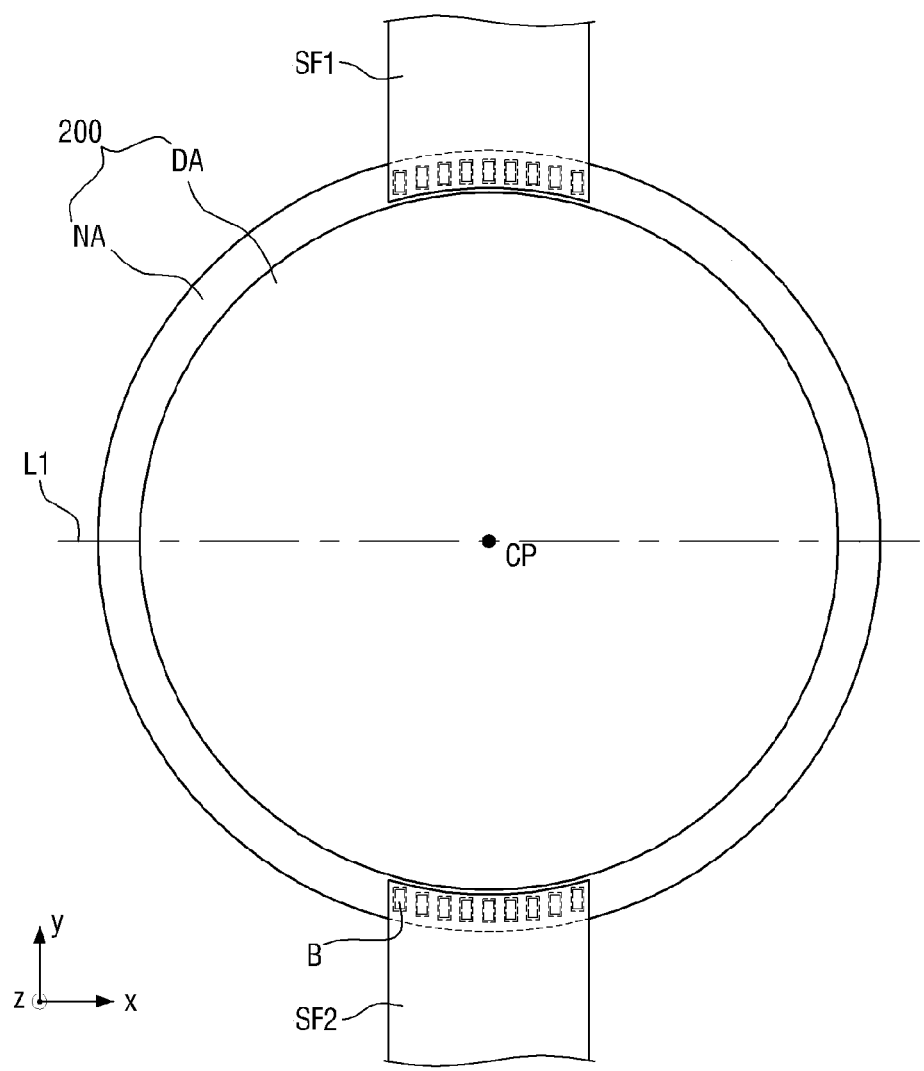
FIG. 10 is a front view of the display device according to another embodiment of the present disclosure.
Figure 11:
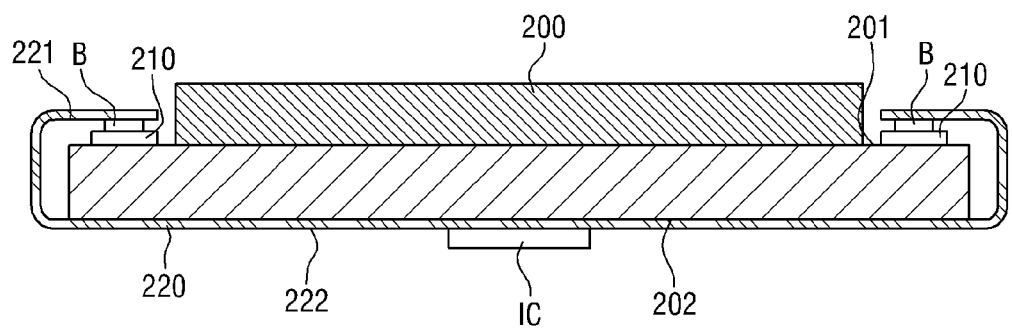
FIG. 11 is a side view of the display device according to another embodiment of the present disclosure.
Figure 12:
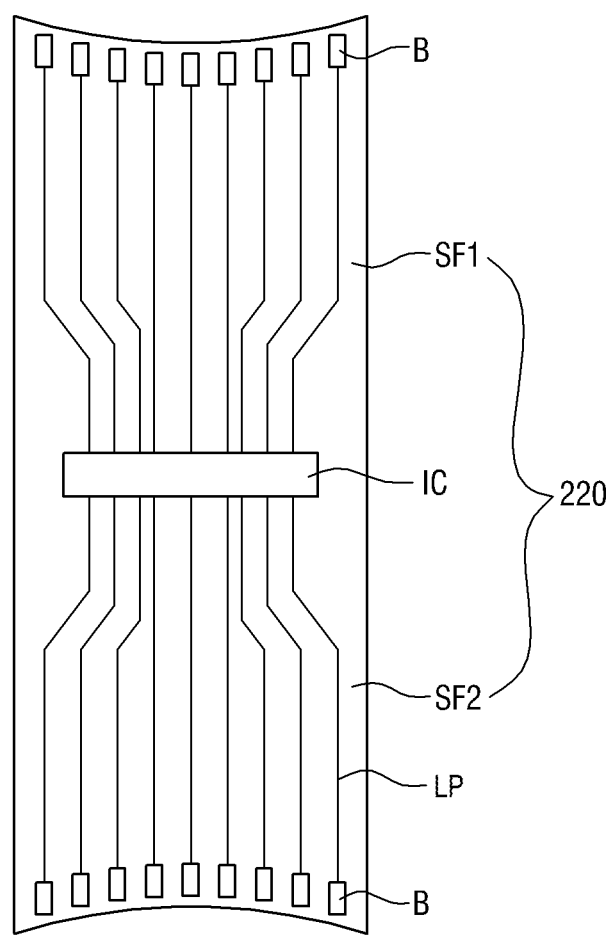
FIG. 12 is a front view of a base film according to another embodiment of the present disclosure.

FIG. 9 is a front view of a panel 200 of a display device 20 according to another embodiment of the present disclosure. FIG. 10 is a front view of the display device according to another embodiment. FIG. 11 is a side view of the display device according to another embodiment. FIG. 12 is a front view of a base film according to another embodiment.

Referring to FIGS. 9 through 12, the display device 20 includes the panel 200 and a pad unit 210 (as shown if FIG. 11).

In some embodiments, the panel 200 may be a display panel that displays images. In some embodiments, a surface of the panel 200 may be circular. However, the present embodiments are not limited thereto, and the panel 200 may also have a shape including an at least partially rounded side. In an exemplary embodiment, the panel 200 may also be elliptical. In some embodiments, the panel 200 may include the pad unit 210 which is disposed adjacent to an outer circumference of the panel 200 and receives external signals. In some embodiments, the panel 200 may include a display area DA and a non-display area NA which surrounds the display area DA. In some embodiments, the non-display area NA may be shaped like, but not limited to, a donut that surrounds the circular display area DA as illustrated in FIG. 9. Display elements may be formed in the display area DA, and the pad unit 210 may be formed in the non-display area NA.

In some embodiments, the pad unit 210 may receive driving signals for driving the panel 200 from an external source. In some embodiments, the driving signals may include gate signals, data signals, etc. In some embodiments, the pad unit 210 may be disposed along a side of the panel 200. That is, the pad unit 210 may be disposed along a curve, not a straight line. In some embodiments, the pad unit 210 may be divided into a plurality of sub-pads SP. In some embodiments, the sub-pads SP may be separated from each other. As illustrated in FIG. 9, the pad unit 210 may be divided into two sub-pads SP, i.e., a first sub-pad SP1 and a second sub-pad SP2. However, the number of the sub-pads SP into which the pad unit 210 is divided is not limited to two. In some embodiments, the pad unit 210 may be divided into four sub-pads SP, i.e., first through fourth sub-pads SP1 through SP4. Also, in some embodiments, the pad unit 210 may be divided into six sub-pads SP, i.e., first through sixth sub-pads SP1 through SP6. In some embodiments, each of the sub-pads SP may receive one or more gate signals or one or more data signals and transmit the received signal or signals to the panel 200. For example, the first sub-pad SP1 may receive a data signal, and the second sub-pad SP2 may receive a gate signal. However, the present embodiments are not limited thereto, and the first sub-pad SP1 may receive a gate signal, and the second sub-pad SP2 may receive a data signal. Also, one sub-pad SP may receive both a data signal and a gate signal and then transmit the received signals to the panel 200.

In some embodiments, the sub-pads SP may be separated by substantially equal distances d1. In addition, the sub-pads SP may be symmetrical with respect to a virtual line that connects a central point CP on the surface of the panel 200 and a point on a side of the panel 200. That is, the first sub-pad SP1 may be symmetrical to the second sub-pad SP2 with respect to a virtual line L1. In addition, each of the sub-pads SP may include a plurality of unit sub-pads. Each of the unit sub-pads may form a step difference with an adjacent unit sub-pad.

In some embodiments, the display device 20 according to the current embodiment may further include a base film 220 on which a semiconductor chip IC for transmitting the external signals to the pad unit 210 is mounted.

The base film 220 may be formed of a material having insulating properties and flexibility. In an exemplary embodiment, the base film 220 may include any one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and various combinations thereof.

In some embodiments, the base film 220 may contact a lower surface 202 of the panel 200, and ends of the base film 220 may be bent to cover ends of an upper surface 201 of a substrate. Here, a surface of the panel 200 which contacts the base film 220 is defined as the lower surface 202, and an opposite surface is defined as the upper surface 201. In some embodiments, the base film 220 may include an upper surface 221 and a lower surface 222. Here, a surface of the base film 220 which contacts the panel 200 is defined as the upper surface 221, and an opposite surface is defined as the lower surface 222. In some embodiments, the semiconductor chip IC may be mounted on the lower surface 222 of the base film 220, and bumps B may be formed on the upper surface 221 of the base film 220. However, the present embodiments are not limited thereto. In some embodiments, the semiconductor chip IC and the bumps B may be formed on the same surface. In some embodiments, the semiconductor chip IC and the bumps B may be connected by wiring LP formed in the base film 220. In some embodiments, the bumps B may be electrically connected to the pad unit 210 formed on the ends of the upper surface 201 of the substrate. That is, the semiconductor chip IC may transmit gate signals and data signals to the pad unit 210 of the display device 20 via the wiring LP.

In some embodiments, the base film 220 may include a plurality of separate sub-films SF. In some embodiments, the sub-films SF may be connected to the sub-pads SP, respectively. That is, as illustrated in FIG. 12, the base film 220 may be divided into two sub-films SF, i.e., a first sub-film SF1 and a second sub-film SF2 by the semiconductor chip IC, and each of the sub-films SF may extend toward a corresponding sub-pad SP. In some embodiments, the shape or number of the semiconductor chips IC is not limited to the example illustrated in FIG. 12. In some embodiments, the semiconductor chip IC may be formed in a plurality, and the semiconductor chips IC may provide individual signals to the sub-films SF, respectively. In some embodiments, the shapes and effects of the sub-films SF and the sub-pads SP will now be described in greater detail with reference to FIG. 13.

Figure 13:
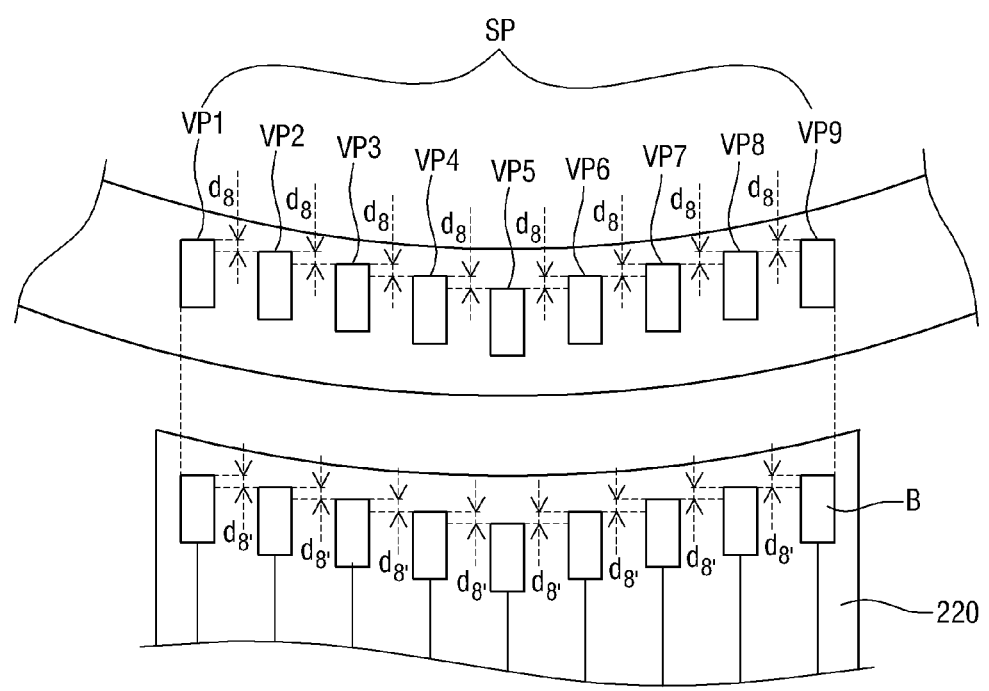
FIG. 13 is a view illustrating the relationship between a sub-film and a sub-pad according to another embodiment of the present disclosure.

FIG. 13 is a view illustrating the relationship between a sub-film and a sub-pad according to another embodiment of the present invention.

Referring to FIG. 13, each of the sub pads SP may include a plurality of unit sub-pads VP. In some embodiments, the number of the unit sub-pads VP may be nine as illustrated in FIG. 13. However, the number of the unit sub-pads VP is not limited to nine. Each of the unit sub-pads VP may form a step difference d8 with an adjacent unit sub-pad VP. In some embodiments, the step difference d8 may have a fixed size. However, the present embodiments are is not limited thereto, and the step difference d8 may also be adjusted such that the unit sub-pads VP can be arranged along a side of the panel 200. That is, the unit-sub pads VP may be arranged in a curve, not a straight line. In addition, a sub-film SF corresponding to the unit sub-pads VP may include a side rounded to correspond to the side of the panel 200. In some embodiments, each bump B included in the sub-film SF may also form a step difference d8' with an adjacent bump B such that the bumps B can correspond to the sub-pad SP. That is, the bumps B may correspond to the unit sub-pads VP of the sub-pad SP, respectively.

As described above, the display device 20 according to an embodiment can provide a plurality of separate sub-pads that can be arranged along a side of a circular panel. Therefore, the creation of an unnecessary non-display area NA can be prevented. In addition, since the display area DA can be relatively expanded in the display device 20 according to an embodiment, an aperture ratio of the display device 20 can be improved. As a result, a display device having a narrow bezel can be provided.

Other elements of the display device 20 are substantially the same as those of the display device 10 identified by the same names in FIGS. 1 through 8, and thus a description thereof will be omitted.

A display device according to another embodiment of the present disclosure will now be described.

Figure 14:
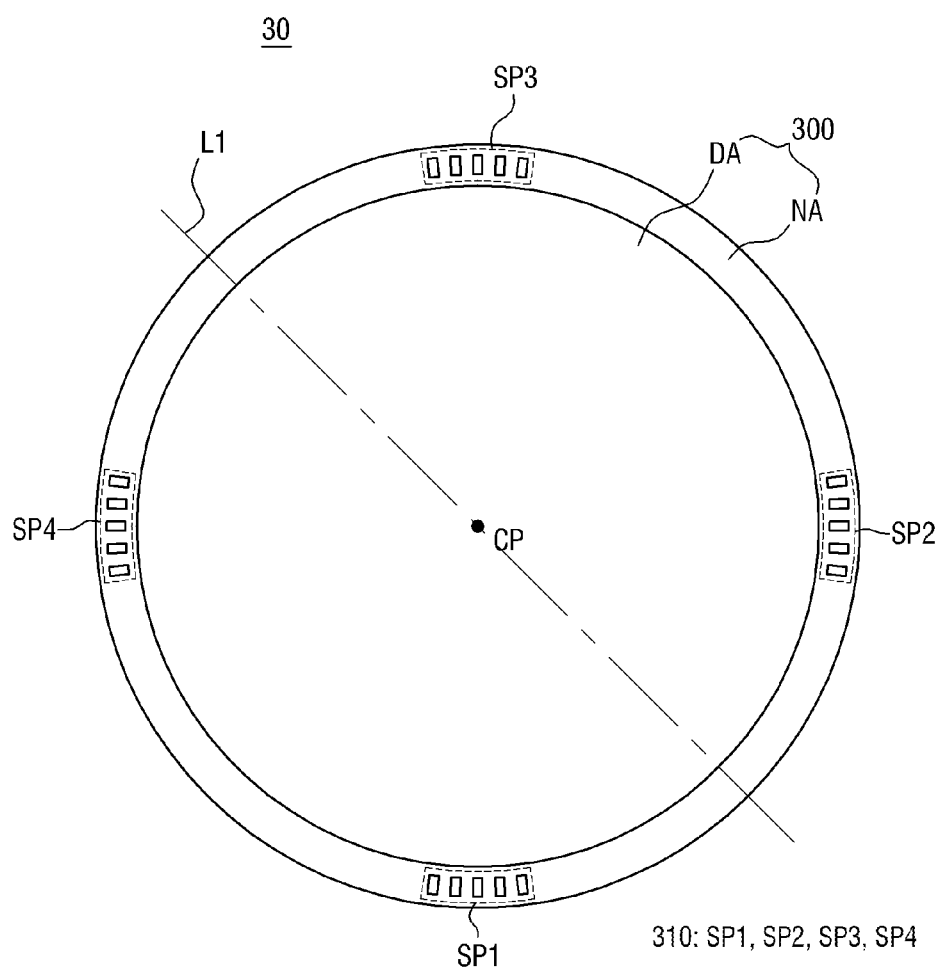
FIG. 14 is a front view of a panel of a display device according to another embodiment of the present disclosure.
Figure 15:
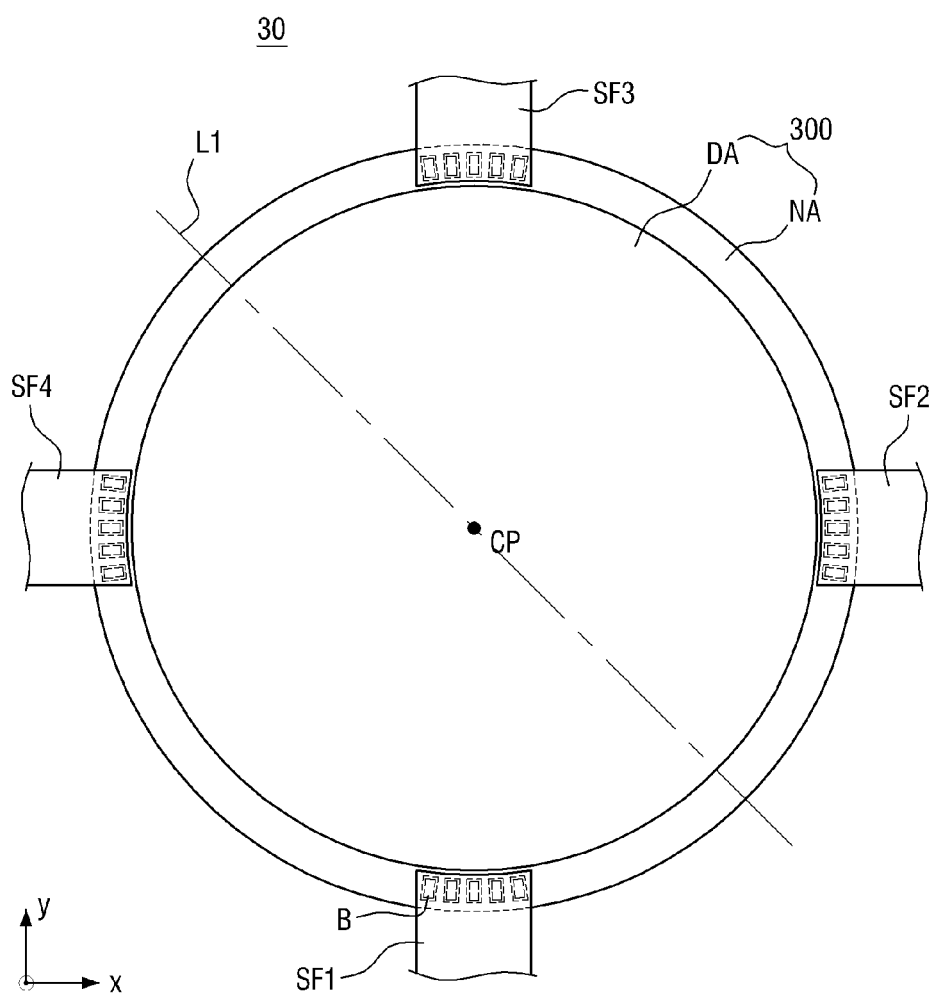
FIG. 15 is a front view of the display device according to another embodiment of the present disclosure.
Figure 16:
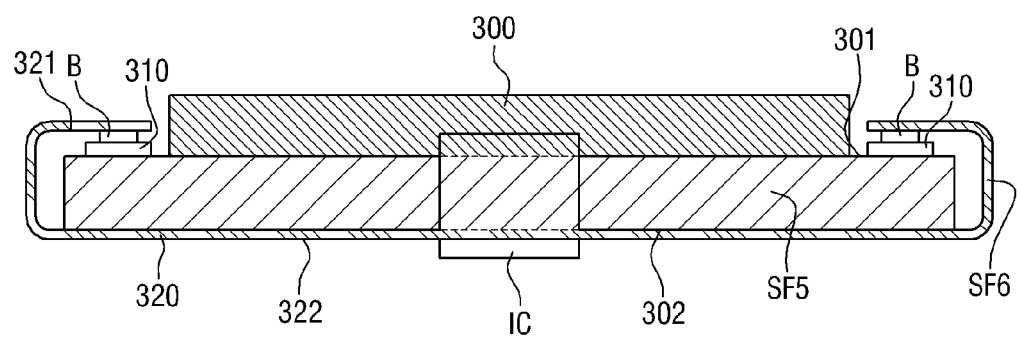
FIG. 16 is a side view of the display device according to another embodiment of the present disclosure.
Figure 17:
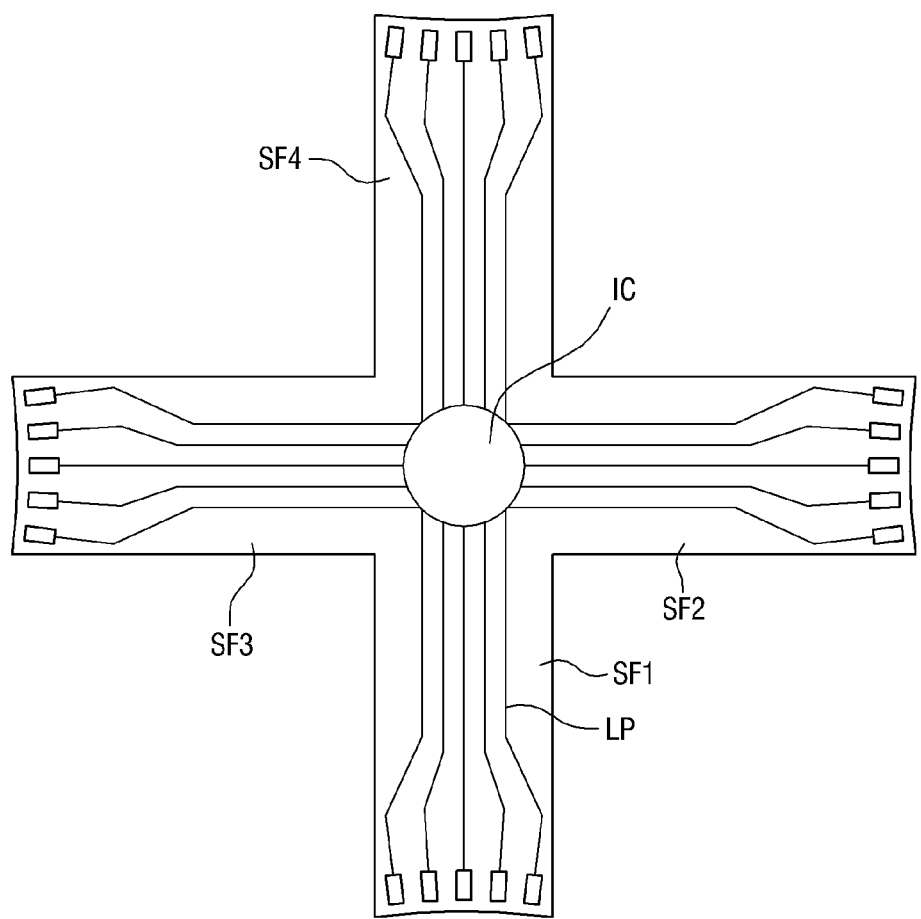
FIG. 17 is a front view of a base film according to another embodiment of the present disclosure.

FIG. 14 is a front view of a panel 300 of a display device 30 according to another embodiment of the present invention. FIG. 15 is a front view of the display device according to another embodiment of the present disclosure. FIG. 16 is a side view of the display device according to another embodiment of the present invention. FIG. 17 is a front view of a base film according to another embodiment of the present invention.

Referring to FIGS. 14 through 17, the display device 30 includes the panel 300 and a pad unit 310.

In some embodiments, the panel 300 may be a display panel that displays images. In some embodiments, a surface of the panel 300 may be circular. However, the present embodiments are not limited thereto, and the panel 300 may also have a shape including an at least partially rounded side. In an exemplary embodiment, the panel 300 may also be elliptical. In some embodiments, the panel 300 may include the pad unit 310 which is disposed adjacent to an outer circumference of the panel 300 and receives external signals. In some embodiments, the panel 300 may include a display area DA and a non-display area NA which surrounds the display area DA. In some embodiments, the non-display area NA may be shaped like, but not limited to, a donut that surrounds the circular display area DA as illustrated in FIG. 14. In some embodiments, display elements may be formed in the display area DA, and the pad unit 310 may be formed in the non-display area NA.

In some embodiments, the pad unit 310 may receive driving signals for driving the panel 300 from an external source. In some embodiments, the driving signals may include gate signals, data signals, etc. In some embodiments, the pad unit 310 may be disposed along a side of the panel 300. That is, the pad unit 310 may be disposed along a curve, not a straight line. In some embodiments, the pad unit 310 may be divided into a plurality of sub-pads SP. In some embodiments, the sub-pads SP may be separated from each other. In addition, the sub-pads SP may be separated from the side of the panel 300 by equal distances.

The pad unit 310 may be divided into four sub-pads SP, i.e., a first sub-pad SP1, a second sub-pad SP2, a third sub-pad SP3 and a fourth sub-pad SP4. However, the number of the sub-pads SP into which the pad unit 310 is divided is not limited to four. In some embodiments, the pad unit 310 may be divided into two sub-pads SP, i.e., a first sub-pad SP1 and a second sub-pad SP2. Also, in some embodiments, the pad unit 310 may be divided into six sub-pads SP, i.e., first through sixth sub-pads SP1 through SP6. In some embodiments, each of the sub-pads SP may receive one or more gate signals or one or more data signals and transmit the received signal or signals to the panel 300. For example, the first sub-pad SP1 and the third sub-pad SP3 may receive data signals, and the second sub-pad SP2 and the fourth sub-pad SP4 may receive gate signals. However, the present embodiments are not limited thereto, and the first sub-pad SP1 and the third sub-pad SP3 may receive gate signals, and the second sub-pad SP2 and the fourth sub-pad SP4 may receive data signals. In some embodiments, one sub-pad SP may receive both a data signal and a gate signal and then transmit the received signals to the panel 300.

In some embodiments, the sub-pads SP may be separated by substantially equal distances d1. In addition, the sub-pads SP may be symmetrical with respect to a virtual line that connects a central point CP on the surface of the panel 300 and a point on a side of the panel 300. That is, the first sub-pad SP1 and the fourth sub-pad SP4 may be symmetrical to the second sub-pad SP2 and the third sub-pad SP3 with respect to a virtual line L1. In addition, each of the sub-pads SP may include a plurality of unit sub-pads. In some embodiments, each of the unit sub-pads may be placed toward the central point CP on the surface of the panel 300.

In some embodiments, the display device 30 according to an embodiment may further include a base film 320 on which a semiconductor chip IC for transmitting the external signals to the pad unit 310 is mounted.

The base film 320 may be formed of a material having insulating properties and flexibility. In an exemplary embodiment, the base film 320 may include any one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and various combinations thereof.

The base film 320 may contact a lower surface 302 of the panel 300, and ends of the base film 320 may be bent to cover ends of an upper surface 301 of a substrate. Here, a surface of the panel 300 which contacts the base film 320 is defined as the lower surface 302, and an opposite surface is defined as the upper surface 301. In some embodiments, the base film 320 may include an upper surface 321 and a lower surface 322. In some embodiments, the base film 320 may be bent on an end and may include an upper surface 321 and a lower surface 322. Here, a surface of the base film 320 which contacts the panel 300 is defined as the upper surface 321, and an opposite surface is defined as the lower surface 322. In some embodiments, the semiconductor chip IC may be mounted on the lower surface 322 of the base film 320, and bumps B may be formed on the upper surface 321 of the base film 320. However, the present embodiments are not limited thereto. In some embodiments, the semiconductor chip IC and the bumps B may be formed on the same surface. In some embodiments, the semiconductor chip IC and the bumps B may be connected by wiring LP formed in the base film 320. In some embodiments, the bumps B may be electrically connected to the pad unit 310 formed on the ends of the upper surface 301 of the substrate. That is, the semiconductor chip IC may transmit gate signals and data signals to the pad unit 310 of the display device 30 via the wiring LP.

In some embodiments, the base film 320 may include a plurality of separate sub-films SF. In some embodiments, the sub-films SF may be connected to the sub-pads SP, respectively. That is, as illustrated in FIG. 17, the base film 320 may be divided into four sub-films SF, i.e., a first sub-film SF1, a second sub-film SF2, a third sub-film SF3 and a fourth sub-film SF4 by the semiconductor chip IC, and each of the sub-films SF may extend toward a corresponding sub-pad SP. In some embodiments, the shape or number of the semiconductor chips IC is not limited to the example illustrated in FIG. 17. In some embodiments, the semiconductor chip IC may be formed in a plurality, and the semiconductor chips IC may provide individual signals to the sub-films SF, respectively. The shapes and effects of the sub-films SF and the sub-pads SP will now be described in greater detail with reference to FIG. 18.

Figure 18:
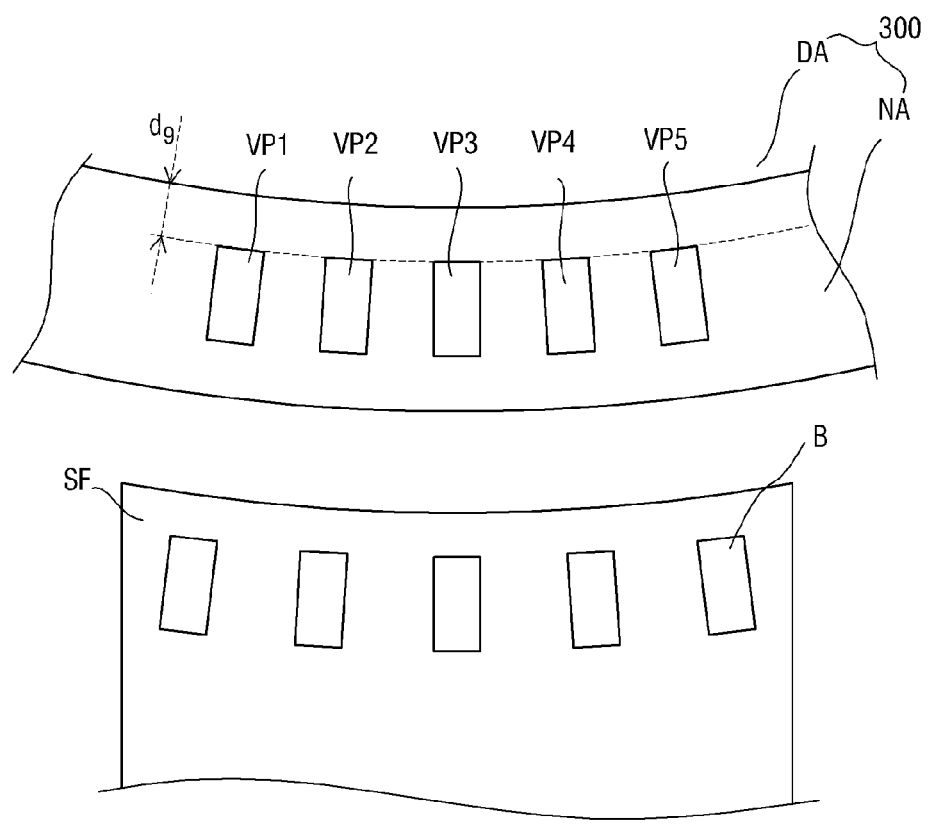
FIG. 18 is a view illustrating the relationship between the sub-films and the sub-pads according to another embodiment of the present disclosure.

FIG. 18 is a view illustrating the relationship between the sub-films and the sub-pads according to another embodiment of the present disclosure.

Referring to FIG. 18, each of the sub pads SP may include a plurality of unit sub-pads VP. In some embodiments, the number of the unit sub-pads VP may be five as illustrated in FIG. 18. However, the number of the unit sub-pads VP is not limited to five. In some embodiments, each of the unit sub-pads VP may be placed toward the central point CP on the surface of the panel 300, and the unit sub-pads VP and a side of the panel 300 may be separated by equal distances d9. That is, a center of each of the unit sub-pads VP and the central point CP on the surface of the panel 300 may lie on a straight line. Accordingly, the unit sub-pads VP may be arranged along the side of the panel 300. That is, the unit-sub pads VP may be arranged in a curve, not a straight line. In addition, a sub-film SF corresponding to the unit sub-pads VP may include a side rounded to correspond to the side of the panel 300. In some embodiments, each bump B included in the sub-film SF may also be placed toward the central point CP on the surface of the panel 300. That is, the bumps B may correspond to the unit sub-pads VP of the sub-pad SP, respectively.

As described above, the display device 30 according to an embodiment can provide a plurality of separate sub-pads that are placed toward the central point CP on the surface of the panel 300. Therefore, the creation of an unnecessary non-display area NA can be prevented. In addition, since the display area DA can be expanded in the display device 30 according to the current embodiment, an aperture ratio of the display device 30 can be improved. As a result, a display device having a narrow bezel can be provided.

Other elements of the display device 30 are substantially the same as those of the display device 10 identified by the same names in FIGS. 1 through 8, and thus a description thereof will be omitted.

Embodiments of the present disclosure provide at least one of the following advantages.

A display device includes a plurality of sub-pads which are separated from each other and placed along an outer circumference of a circular substrate. Therefore, a non-display area of the display device can be reduced in size.

In addition, an aperture of the display device can be improved.

However, the effects of the present embodiments are not restricted to the one set forth herein. The above and other effects of the present embodiments will become more apparent to one of daily skill in the art to which the present invention pertains by referencing the claims.

While the embodiments have been described with reference to preferred embodiments, those skilled in the art will appreciate that various modifications and applications are possible, without departing from the scope and spirit of embodiments disclosed in the accompanying claims. For example, each element specified in embodiments can be variously modified and implemented. Further, differences related to such modifications and applications should be interpreted as being included in the scope of the embodiments defined by the accompanying claims.

What is claimed is:

1. A display device comprising:
a panel having a circular surface;
a pad unit which is disposed adjacent to an outer circumference of the panel and receives a driving signal for the panel; and
a base film on which a semiconductor chip is mounted, wherein the base film comprises a plurality of separate sub-films, and each of the sub-films comprises bumps connected to one of the sub-pads,
wherein the driving signal includes gate signals and data signals,
wherein the pad unit is divided into a plurality of sub-pads, and the sub-pads are separated from each other.

2. The display device of claim 1, wherein the bumps are formed to correspond to each of the sub-pads.

3. The display device of claim 1, wherein the sub-pads are separated by substantially equal distances.

4. The display device of claim 1, wherein the sub-pads are symmetrical with respect to a virtual line that connects a central point on the surface of the panel and a point on a side of the panel.

5. The display device of claim 1, wherein the sub-pads extend in a direction and have equal lengths.

6. The display device of claim 1, wherein the panel comprises a display area in which display elements are located and a non-display area which surrounds the display area, wherein the pad unit is formed in the non-display area.

7. A display device comprising:
a panel having a circular surface;
a pad unit which is disposed adjacent to an outer circumference of the panel and receives a driving signal for the panel; and
a base film on which a semiconductor chip is mounted, wherein the base film comprises a plurality of separate sub-films, and each of the sub-films comprises bumps connected to one of the sub-pads,
wherein the driving signal includes gate signals and data signals,
wherein the pad unit is divided into a plurality of sub-pads, and the sub-pads are arranged along a side of the panel to be separated from each other.

8. The display device of claim 7, wherein each of the sub-pads comprise a plurality of unit sub-pads, wherein each of the unit sub-pads forms a step difference with an adjacent unit sub-pad.

9. The display device of claim 7, wherein the sub-pads are symmetrical with respect to a virtual line that connects a central point on the surface of the panel and a point on the side of the panel.

10. The display device of claim 7, wherein the bumps are formed to correspond to each of the sub-pads.

11. The display device of claim 7, wherein each of the sub-films has a side rounded to correspond to the side of the panel.

12. The display device of claim 7, wherein the panel comprises a display area in which display elements are located and a non-display area which surrounds the display area, wherein the pad unit is formed in the non-display area.

13. A display device comprising:
a panel having a circular surface;
a pad unit which is disposed adjacent to an outer circumference of the panel and receives a driving signal for the panel; and
a film on which a semiconductor chip is mounted, wherein the film comprises a plurality of separate sub-films, and each of the sub-films comprises bumps connected to one of the sub-pads,
wherein the driving signal includes gate signals and data signals,
wherein the pad unit is divided into a plurality of sub-pads which are arranged along a side of the panel, wherein the sub-pads are separated from each other, and the sub-pads and the side of the panel are separated by equal distances.

14. The display device of claim 13, wherein each of the sub-pads comprise a plurality of unit sub-pads, wherein each of the unit sub-pads is placed toward a central point on the surface of the panel.

15. The display device of claim 13, wherein the bumps are formed to correspond to each of the sub-pads.

16. The display device of claim 13, wherein each of the sub-films has a side rounded to correspond to the side of the panel.

17. The display device of claim 13, wherein the panel comprises a display area in which display elements are located and a non-display area which surrounds the display area, wherein the pad unit is formed in the non-display area.

* * * * *